United States Patent
Chen et al.

(10) Patent No.: US 11,728,324 B2
(45) Date of Patent: Aug. 15, 2023

(54) SEMICONDUCTOR STRUCTURE HAVING PHOTONIC DIE AND ELECTRONIC DIE

(71) Applicant: Taiwan Semiconductor Manufacturing Company, Ltd., Hsinchu (TW)

(72) Inventors: Hsien-Wei Chen, Hsinchu (TW); Ming-Fa Chen, Taichung (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 17/849,731

(22) Filed: Jun. 27, 2022

(65) Prior Publication Data
US 2022/0328468 A1  Oct. 13, 2022

Related U.S. Application Data

(63) Continuation of application No. 16/885,242, filed on May 27, 2020, now Pat. No. 11,404,404.

(51) Int. Cl.
| | |
|---|---|
| *H01L 25/18* | (2023.01) |
| *H01L 23/00* | (2006.01) |
| *H01L 21/56* | (2006.01) |
| *H01L 21/78* | (2006.01) |

(52) U.S. Cl.
CPC ............. *H01L 25/18* (2013.01); *H01L 21/56* (2013.01); *H01L 21/78* (2013.01); *H01L 24/05* (2013.01); *H01L 24/45* (2013.01); *H01L 24/94* (2013.01); *H01L 2224/00* (2013.01)

(58) Field of Classification Search
CPC ......... H01L 25/18; H01L 24/05; H01L 24/45; H01L 24/95; H01L 21/56; H01L 21/78
See application file for complete search history.

(56) References Cited

U.S. PATENT DOCUMENTS

| | | | | |
|---|---|---|---|---|
| 8,993,380 | B2 * | 3/2015 | Hou | H01L 23/3135 |
| | | | | 438/112 |
| 9,735,131 | B2 * | 8/2017 | Su | H01L 25/50 |
| 10,162,139 | B1 * | 12/2018 | Wang | G02B 6/122 |
| 11,404,404 | B2 * | 8/2022 | Chen | H01L 25/18 |
| 2016/0027754 | A1 * | 1/2016 | Katagiri | H01L 24/13 |
| | | | | 257/737 |
| 2021/0313254 | A1 * | 10/2021 | Chen | H01L 23/49503 |

* cited by examiner

*Primary Examiner* — Nicholas J Tobergte
(74) *Attorney, Agent, or Firm* — JCIPRNET

(57) ABSTRACT

A semiconductor structure includes an encapsulated die including an electronic die and an insulating layer laterally covering the electronic die, and a photonic die coupled to the encapsulated die. The photonic die includes an optical device in proximity to an edge coupling facet of a portion of a sidewall of the photonic die, wherein a surface roughness of the edge coupling facet is less than a surface roughness of a sidewall of the insulating layer or a surface roughness of another portion of the sidewall of the photonic die.

20 Claims, 17 Drawing Sheets

SEMICONDUCTOR STRUCTURE HAVING PHOTONIC DIE AND ELECTRONIC DIE

CROSS-REFERENCE TO RELATED APPLICATION

This application is a continuation application of and claims the priority benefit of a prior application Ser. No. 16/885,242, filed on May 27, 2020. The entirety of the above-mentioned patent application is hereby incorporated by reference herein and made a part of this specification.

BACKGROUND

Currently, semiconductor structures including both photonic dies (known as P-dies) and electronic dies (known as E-dies) are becoming increasingly popular for their compactness. In addition, due to the widely use of optical fiber-related applications for signal transmission, optical signaling and processing have been used in more applications. Although existing methods of fabricating the semiconductor structures have been generally adequate for their intended purposes, they have not been entirely satisfactory in all respects. For example, challenges rise to develop robust process for interconnecting among P-dies, E-dies, and optical fibers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
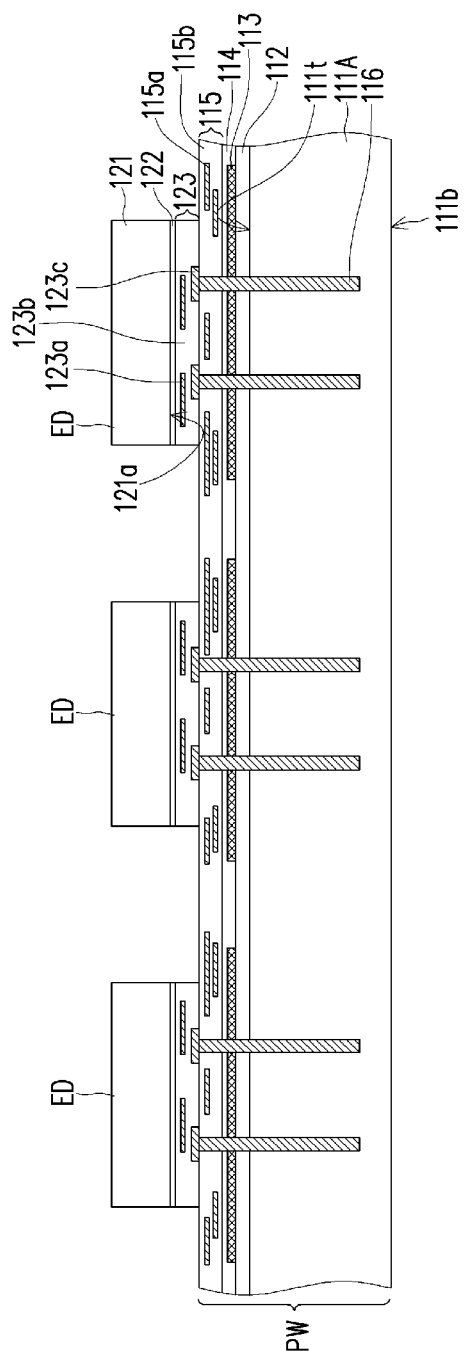
FIGS. 1A-1F are schematic cross-sectional views of various stages of manufacturing a semiconductor structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments of the present disclosure are discussed in the context of semiconductor manufacturing, and in particular, in the context of forming a semiconductor structure including a photonic die and an electronic die. Some variations of embodiments are discussed and the intermediate stages of forming the semiconductor structure are illustrated in accordance with some embodiments. It should be appreciated that the illustration throughout the drawings are schematic and not in scale.

Figure 1B:
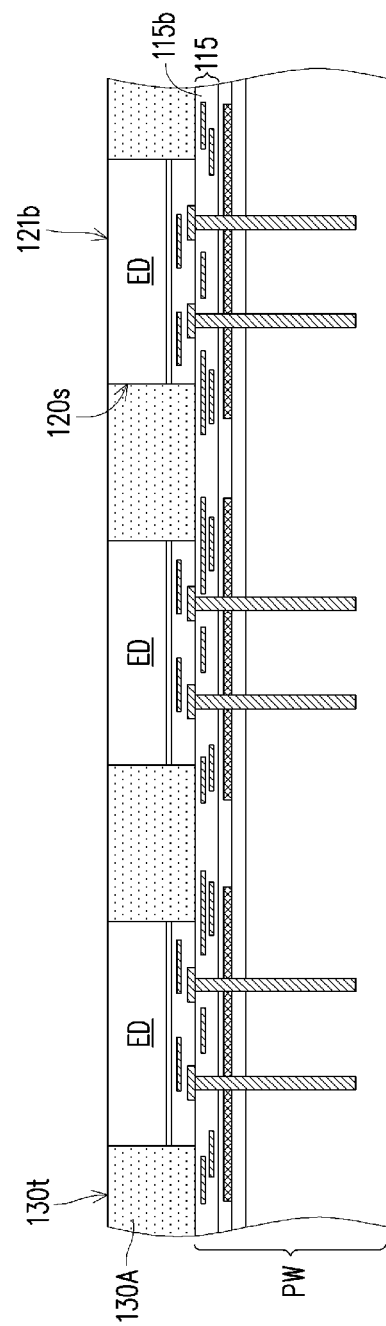
Figure 1C:
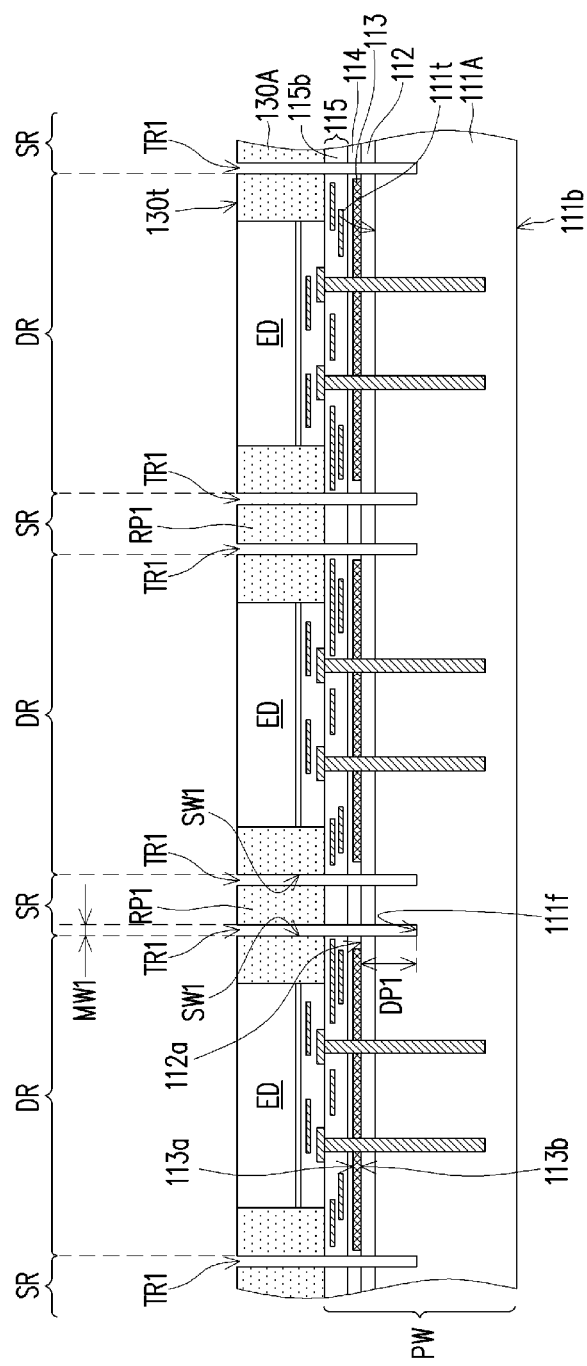
Figure 1D:
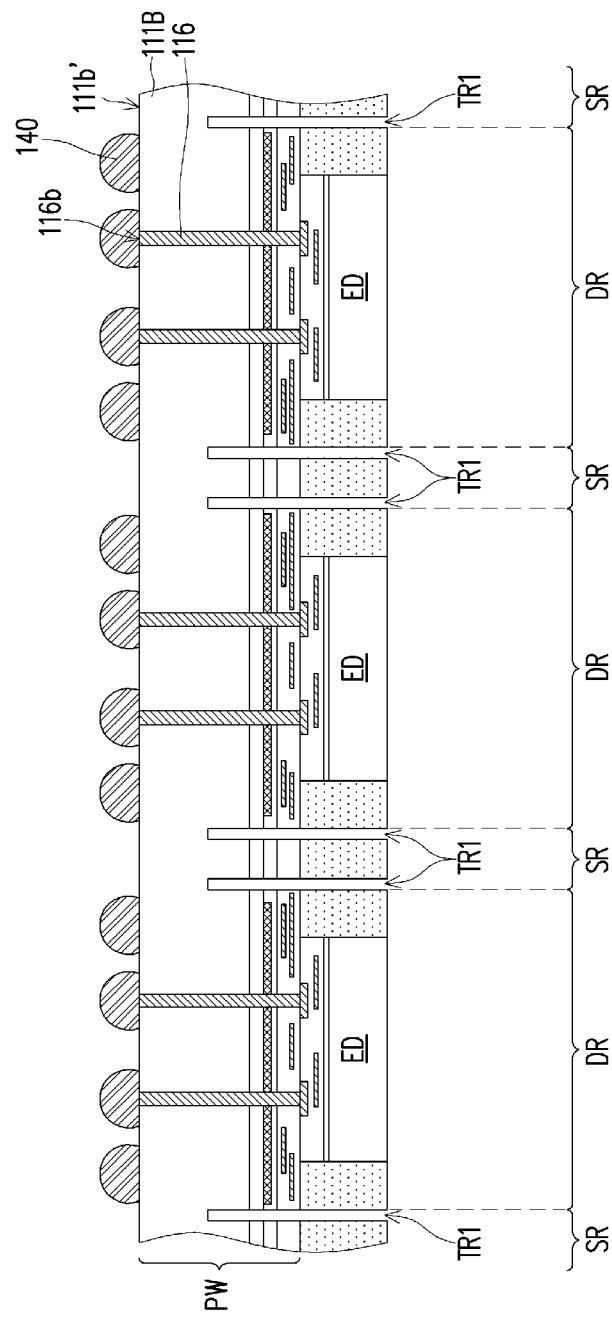
Figure 1E:
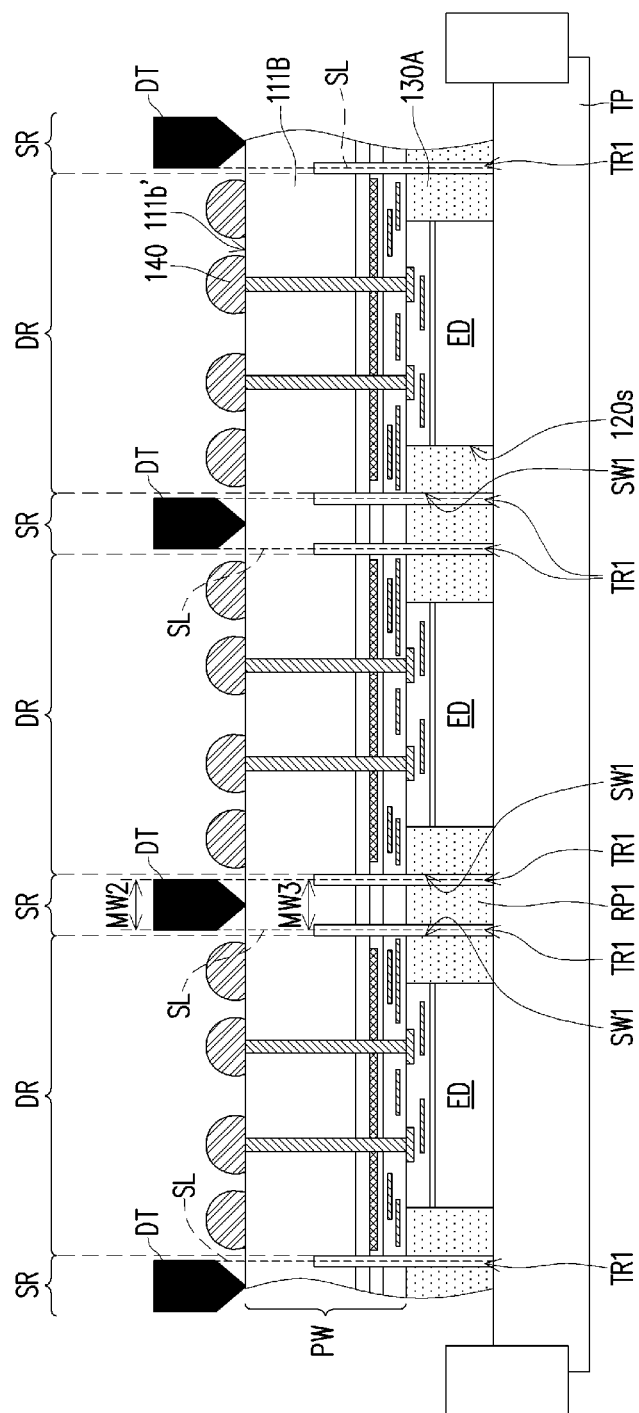
Figure 1F:
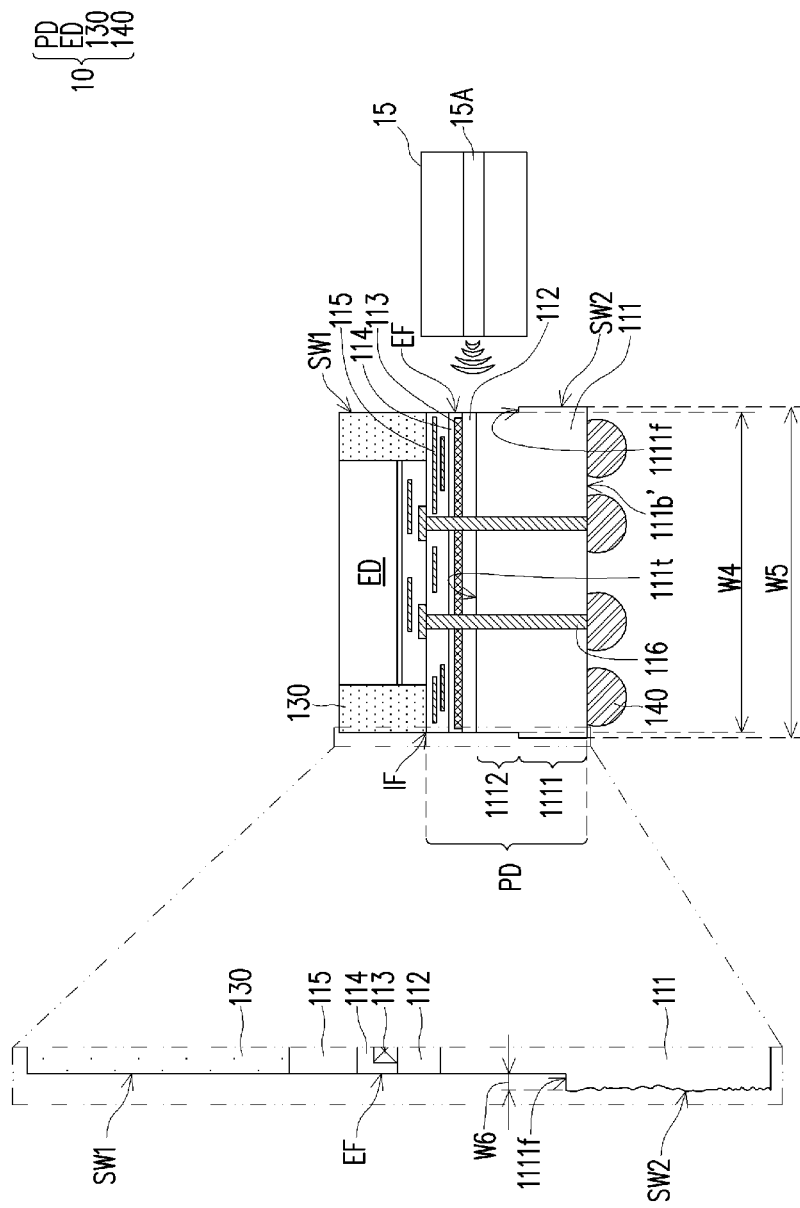
Figure 2A:
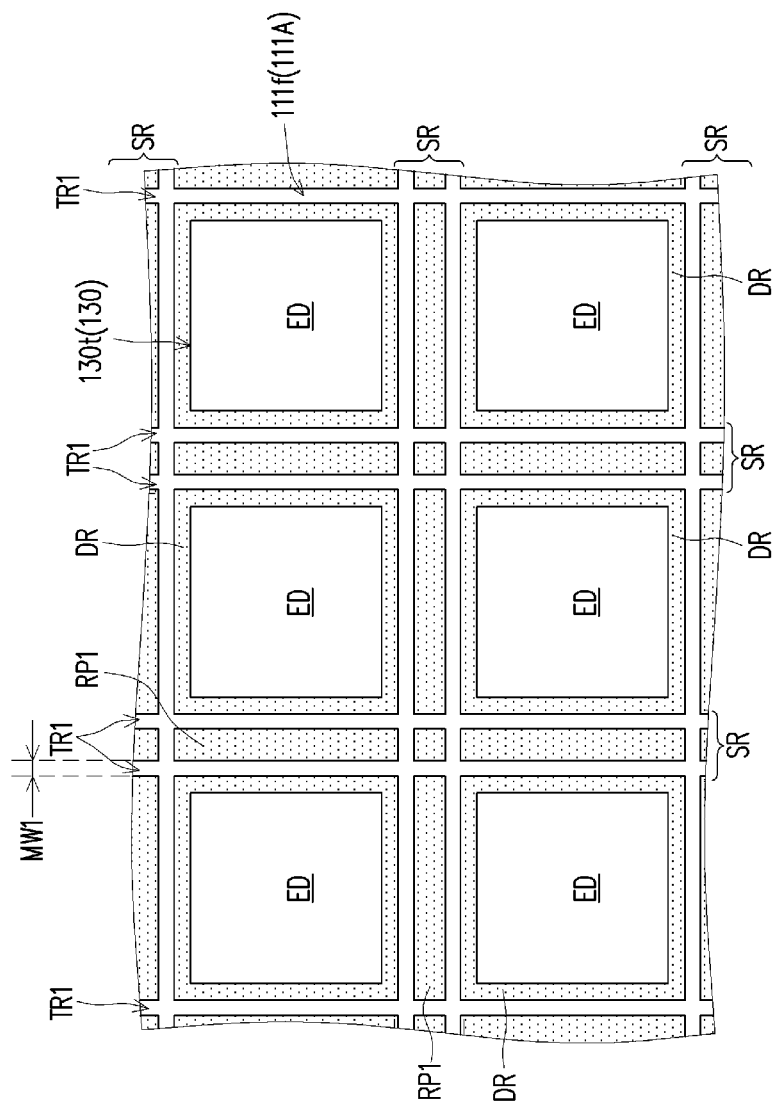
FIG. 2A is a schematic top view of FIG. 1C in accordance with some embodiments.
Figure 2B:
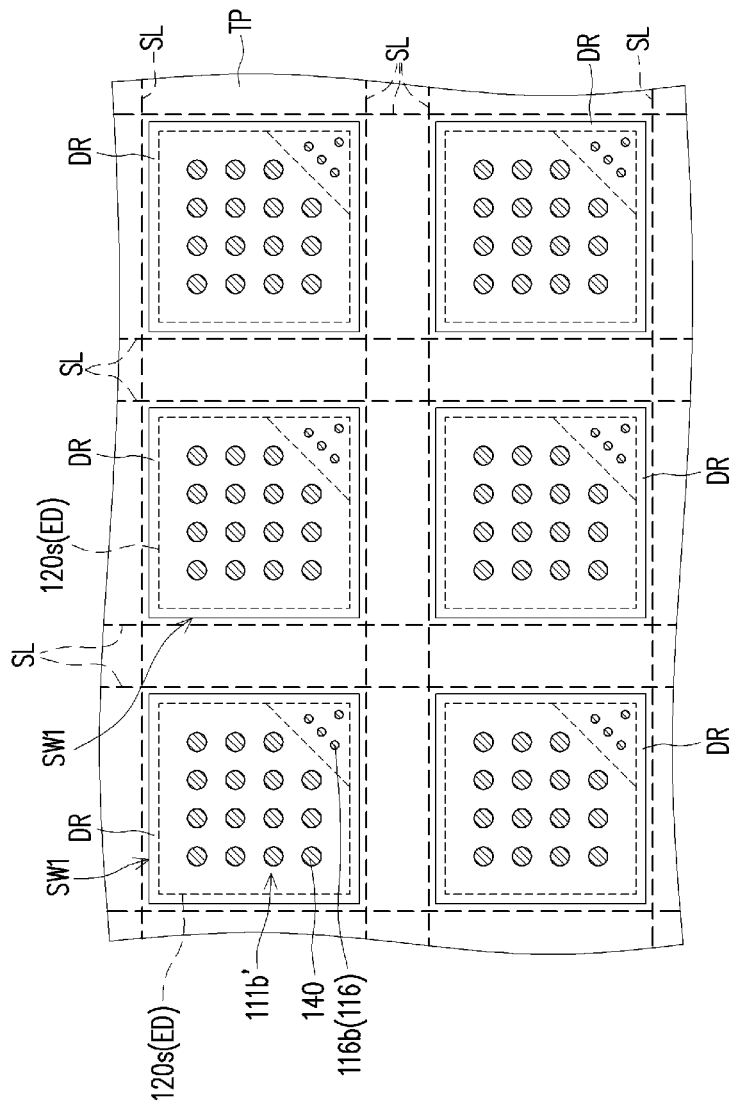
FIG. 2B is a schematic top view of FIG. 1E in accordance with some embodiments.

FIGS. 1A-1F are schematic cross-sectional views of various stages of manufacturing a semiconductor structure in accordance with some embodiments, FIG. 2A is a schematic top view of FIG. 1C in accordance with some embodiments, and FIG. 2B is a schematic top view of FIG. 1E in accordance with some embodiments.

Referring to FIG. 1A, a plurality of electronic dies ED may be bonded to a photonic wafer PW. In some embodiments, the photonic wafer PW may include photonic integrated circuit to process, receive, and/or transmit optical signals. At least one of the electronic dies ED may include electronic integrated circuits for processing the electrical signals converted from the optical signals in the photonic die which may be subsequently singulated from the photonic wafer PW. In some embodiments, the respective electronic die ED exchanges the electrical signals with the photonic die. In some embodiments, the photonic die singulated from the photonic wafer PW is a photonic integrated circuit (PIC) die and the electronic die ED is an electronic integrated circuit (EIC) die.

For example, the photonic wafer PW includes a semiconductor material 111A, an insulator layer 112 formed on a front surface 111t of the semiconductor material 111A, a plurality of optical devices 113 formed on the insulator layer 112, a dielectric layer 114 formed on the insulator layer 112 to cover the optical devices 113, a redistribution structure 115 formed on the optical devices 113 and the dielectric layer 114, and a plurality of through vias 116 vertically extending from the redistribution structure 115 to the semiconductor material 111A. It is noted that FIG. 1A shows that the through vias 116 pass through the optical devices 113; however, in the plan view (not shown), the through vias 116 and the optical devices 113 are offset from one another and the through vias 116 may not be physically contact with or penetrate through the optical devices 113. At this stage, the through vias 116 may not be accessibly exposed by the semiconductor material 111A in accordance with some embodiments.

The insulator layer 112 may be or may include a buried oxide (BOX) layer, a silicon oxide layer, or the like. The semiconductor material 111A may be a silicon substrate, a glass substrate, or other suitable semiconductor substrate. In some embodiments, a semiconductor-on-insulator (SOI) substrate is patterned to form the optical devices 113 on the insulator layer 112 above the semiconductor material 111A. The optical devices 113 may be or may include waveguides, edge couplers, I/O couplers, lasers, optical modulators, detectors, splitters, converters, switches, grating couplers, etc. In some embodiments, the optical devices 113 are edge couplers which have broad bandwidth with small polarization dependent loss. In some embodiments, at least one of the optical devices 113 is disposed in a die region (DR; shown in FIG. 1C) and may be at least laterally covered by the dielectric layer 114. In some embodiments, the optical devices 113 are embedded in the dielectric layer 114. The dielectric layer 114 may be formed of silicon oxide, silicon nitride, a combination thereof, or the like, and may be formed by chemical vapor deposition (CVD), physical vapor deposition (PVD), atomic layer deposition (ALD), a spin-on-dielectric process, the like, or a combination thereof.

It is noted that the configuration of the photonic wafer PW illustrated herein is an example. In some other embodiments, the photonic wafer PW may include a semiconductor substrate, such as a bulk semiconductor or the like, which may be doped (e.g., with a p-type or an n-type dopant) or undoped. The semiconductor substrate may be a silicon wafer. Other substrates, such as a multi-layered or gradient substrate may also be used. In some embodiments, the material of the semiconductor substrate of the photonic wafer PW may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, a front side of the semiconductor substrate is patterned to form the optical devices 113, and the dielectric layer 114 is formed on the front side of the semiconductor substrate to cover the optical devices 113. That is, the insulator layer 112 may be omitted in accordance with some embodiments.

In some embodiments, the redistribution structure 115 includes conductive features 115a formed in dielectric layers 115b. In some embodiments, the first surfaces of the through vias 116 and the first surface of the dielectric layers 115b are substantially leveled for bonding. The conductive features 115a may include conductive lines, conductive pads, and conductive vias, etc. For example, the conductive features 115a are formed by a damascene process (e.g., single damascene or dual damascene) or other suitable process. The dielectric layers 115b may be formed of silicon oxide, silicon nitride, a low-k dielectric material, a combination thereof, or the like, and may be formed by CVD, PVD, ALD, a spin-on-dielectric process, the like, or a combination thereof. Other suitable techniques may be used to form the conductive features 115a and the dielectric layers 115b. In some embodiments, seal rings (not shown) including dummy conductive features are formed in the redistribution structure 115 around the perimeters of each of the die region (DR; shown in FIG. 1C). In some embodiments, there is no seal ring formed in the redistribution structure 115.

Continue to FIG. 1A, the electronic die ED may be or may include logic IC dies, memory dies, analog IC dies, application-specific IC (ASIC) dies, or the like. In some other embodiments, the electronic die ED is a package structure of which a plurality of die components is encapsulated in a packaging encapsulation (e.g., molding compound; not shown). In some embodiments, the electronic dies ED are distributed in an array on the photonic wafer PW. For example, the respective electronic die ED includes a substrate 121, a plurality of active/passive devices 122 formed on a front surface 121a of the substrate 121, an interconnect structure 123 formed over the substrate 121 and electrically coupled to the active/passive devices 122. The substrate 121 of the electronic die ED may be a silicon substrate or a substrate formed of other semiconductor materials such as germanium, silicon germanium, a III-V compound semiconductor material, or the like. Examples of active devices include, but are not limited to, diodes, field effect transistors (FETs), metal-oxide-semiconductor FETs (MOSFETs), complementary metal-oxide-semiconductor (CMOS) transistors, and bipolar transistors. Examples of passive devices include, but are not limited to, resistors, capacitors, and inductors.

In some embodiments, the interconnect structure 123 of the electronic die ED includes conductive features 123a formed in dielectric layers 123b. The conductive features 123a may include conductive lines, conductive pads, and conductive vias, and may be formed by a damascene process (e.g., single damascene or dual damascene) or other suitable process. The dielectric layers 123b may be formed of silicon oxide, silicon nitride, a low-k dielectric material, a combination thereof, or the like, and may be formed by CVD, PVD, ALD, a spin-on-dielectric process, the like, or a combination thereof. Other suitable techniques may be used to form the conductive features 123a and the dielectric layers 123b. In some embodiments, the interconnect structure 123 of the electronic die ED includes bonding pads 123c formed in the top of the dielectric layers 123b. For example, the bonding pads 123c are electrically coupled to the active/passive devices 122 through the conductive features 123a. In some embodiments, the bonding surfaces of the bonding pads 123c and the first surface of the dielectric layers 123b are substantially leveled.

Still referring to FIG. 1A, the electronic dies ED may be bonded to the photonic wafer PW in a face-to-face manner. For example, the bonding may include hybrid bonding, fusion bonding, direct bonding, dielectric bonding, metal bonding, solder joints (e.g., micro-bumps), or the like. In some embodiments, the interconnect structure 123 of the electronic die ED is bonded to the redistribution structure 115 of the photonic wafer PW. For example, the bonding pads 123c of the electronic die ED are bonded to the through vias 116 exposed by the redistribution structure 115 of the photonic wafer PW. The top of the dielectric layers 123b of the electronic die ED may be bonded to the top of the dielectric layers 115b of the photonic wafer PW through dielectric bonding. In some embodiments, after the bonding, each of the electronic die ED may correspond to at least one of the optical devices 113. For example, the bonding area of the respective electronic die ED overlaps the area occupied by at least one of the optical devices 113 in the top view. In some other embodiments, the respective electronic die ED may correspond to multiple optical devices 113. It is also noted that the size, the number, and the configuration of the photonic wafer PW and/or the electronic dies ED are depicted for illustration purpose only, and other embodiments may utilize fewer or additional elements.

Referring to FIG. 1B, an insulating material 130A is formed on the redistribution structure 115 of the photonic wafer PW to at least laterally cover the electronic dies ED. For example, the insulating material 130A is formed on the top of the dielectric layers 115b of the redistribution structure 115. The insulating material 130A may fill the gap between adjacent electronic dies ED and may extend along the sidewalls 120s of the respective electronic die ED. The insulating material 130A may include silicon oxide, silicon nitride, silicon carbide, fluoride-doped silicate glass (FSG), low-k dielectric, and/or other materials. In some embodiments, the insulating material 130A is formed through CVD, PECVD, ALD, or the like. In some embodiments, the insulating material 130A is referred to as "gap-fill oxide". In some alternative embodiments, the insulating material 130A includes a molding compound, a molding underfill, a resin (such as epoxy), or the like. Other suitable insulating material that can provide a degree of protection for the electronic dies ED may be used. In some embodiments, a planarization process (e.g., chemical mechanical polishing (CMP), grinding, etching, etc.) is performed so that the first surface 130t of the insulating material 130A and the rear surface 121b of the substrate 121 of the respective electronic die ED are substantially leveled. In some alternative embodiments, the rear surfaces 121b of the electronic dies ED may be covered by the insulating material 130A.

Referring to FIGS. 1B-1C and also with reference to FIG. 2A, a plurality of trenches TR1 may be formed in the insulating material 130A and may extend into the photonic wafer PW. For example, the trenches TR1 are formed in a sacrificial region SR, wherein the sacrificial region SR is between adjacent two of the electronic dies ED. In some embodiments, the portion of the redistribution structure 115 in the sacrificial region SR includes only the dielectric layers 115b, and there is no conductive feature 115a in the sacrificial region SR. In some embodiments, adjacent two of the trenches TR1 are physically separated from one another by a remaining portion RP1 in the sacrificial region SR. For example, the remaining portion RP1 in the sacrificial region SR includes the insulating material 130A, the underlying redistribution structure 115, the underlying dielectric layer 114, the underlying insulator layer 112, and the underlying semiconductor material 111A.

In some embodiments, the formation of the trenches TR1 includes a lithography process and an etching process. For example, the lithography process includes forming a resist layer (not shown) over the insulating material 130A, exposing the resist layer to a pattern that defines the trenches TR1, performing a post-exposure baking process, and developing the resist layer to form a patterned resist including the trench pattern. The patterned resist serving as a mask may be then used for etching trenches into the insulating material 130A, and the patterned resist is subsequently removed. The etching step may include one or more dry etching processes. The dry etching method includes, but not limited to, reactive ion etch (RIE), inductively coupled plasma (ICP) etching, transformer coupled plasma (TCP) etching, electron cyclotron resonance (ECR etching, and/or the like. Other suitable removing techniques (e.g., wet etching, laser process, etc.) may be used.

In some embodiments, the etching is a time-controlled process, and it continues until the trenches TR1 with predetermined depth are created in the insulating material 130A and the photonic wafer PW. In some embodiments, the trench TR1 penetrates through the insulating material 130A but does not penetrate through the photonic wafer PW. For example, the trench TR1 penetrates through the insulating material 130A, the underlying redistribution structure 115, the underlying dielectric layer 114, and the underlying insulator layer 112. In some embodiments, the trench TR1 further extends into the underlying semiconductor material 111A. For example, the bottom of the trench TR1 is at an intermediate level between the front surface 111t and the rear surface 111b of the semiconductor material 111A. The trenches TR1 may not penetrate through the photonic wafer PW at this stage in accordance with some embodiments.

In some embodiments, a facet 111f of the semiconductor material 111A is accessibly exposed by the trenches TR1. Accordingly, the facet 111f of the semiconductor material 111A is shown in the top view of the FIG. 2A. In some alternative embodiments, the facet 111f is on the front surface 111t of the semiconductor material 111A. In some embodiments, a vertical distance DP1 is between the facet 111f of the semiconductor material 111A and the first surface 112a of the insulator layer 112, wherein the optical device 113 is disposed on the first surface 112a of the insulator layer 112. The vertical distance DP1 may be a shortest vertical distance between the bottom of the trench TR1 and the optical device 113. The shortest vertical distance may ensure the edge facet of the photonic die for optically coupling the fiber is formed by dry etching. In some embodiments, the optical device 113 includes a first surface 113a and a second surface 113b opposite to each other, where the first surface 113a may be covered by the dielectric layer 114 and the second surface 113b may be disposed on the first surface 112a of the insulator layer 112. In some embodiments, the second surface 113b of the optical device 113 is separated from the facet 111f of the semiconductor material 111A (or the bottom of the trench TR1) by the vertical distance DP1. For example, the vertical distance DP1 is non-zero. In some embodiments, the vertical distance DP1 is about 10 µm or greater than 10 µm, although other value is also possible.

In some embodiments, after forming the trenches TR1, the insulating material 130A, the underlying redistribution structure 115, the underlying dielectric layer 114, the underlying insulator layer 112, and the underlying semiconductor material 111A may have substantially coterminous sidewalls. The coterminous sidewalls that define the trench TR1 may be referred to as the etched sidewalls SW1 in the disclosure. In some embodiments, the etching is performed through an anisotropic etching, so that the etched sidewalls SW1 that define the trench TR1 are straight and vertical. In some embodiments, the trench TR1 has a substantially rectangular shape along its length and a substantially rectangular cross-sectional profile. For example, the etched sidewalls SW1 are perpendicular to the first surface 130t of the insulating material 130A. In some embodiments, due to process variations, the trench TR1 is slightly tapered toward the semiconductor material 111A, and the etched sidewalls SW1 are substantially perpendicular to (with a slight tilting) the first surface 130t of the insulating material 130A. In some embodiments, the maximum width MW1 of the respective trench TR1 ranges from about 2 µm to about 50 µm. It should be understood that the trenches TR1 may have various depths, aspect ratios, shapes and profiles, depending upon the process recipe.

In some embodiments, in the top view of FIG. 2A, each pair of trenches TR1 between two neighboring electronic dies ED may form two parallel paths. For example, two parallel trenches TR1 extend along each sidewall 120s of the corresponding electronic dies ED. In some embodiments, the trenches TR1 are formed as a plurality of intersecting paths which are arranged as mutually perpendicularly sets. For example, each electronic die ED may be encircled by, e.g., four pairs of trenches TR1 in the top view, with each side of the electronic die ED having two parallel trenches TR1 extending along the side of the electronic die ED. In some embodiments, the trenches TR1 formed as the intersecting paths are located at the portion of the insulating material 130A between each of rows and columns of the electronic dies ED. In some embodiments, the trenches TR1 formed as the intersecting paths are consecutive and in communication with one another. In some other embodiments, the trenches TR1 are formed as spaced apart recesses in the insulating material 130A, and these spaced apart recesses may be arranged along a path encircling the respective electronic die ED. It should be noted that the arrangement of the trenches TR1 illustrated in FIG. 2A is an example, and the trenches TR1 may have other suitable configuration(s) as long as the trench defines a die region DR to form a border thereabouts, and the respective electronic die ED laterally covered by the insulating material 130A is within the die region DR.

Referring to FIG. 1D, the thickness of the semiconductor material 111A is reduced to form the thinned semiconductor material 111B, and the through vias 116 are accessibly revealed by the thinned semiconductor material 111B for further electrical connection. In some embodiments, the structure is turned upside down after forming the trenches TR1 for performing a thinning process. In some embodiments, the structure is flipped and then placed on a tape holder or a temporary carrier (not shown) for the thinning. The thinning process (e.g., a chemical mechanical polish (CMP), a mechanical grinding, or the like) may be performed on the rear surface 111b of the semiconductor material 111A until the through vias 116 are exposed. In some embodiments, the surfaces 116b of the through vias 116 and the rear surface 111b' of the thinned semiconductor material 111B are substantially leveled.

Continue to FIG. 1D, a plurality of conductive terminals 140 may be formed over the rear surface 111b' of the thinned semiconductor material 111B to be electrically coupled to the through vias 116. For example, the conductive terminals 140 are formed within the die region DR. The conductive terminals 140 may not be formed in the sacrificial region SR. The conductive terminals 140 may include a conductive material such as solder, copper, aluminum, gold, nickel, silver, palladium, tin, a combination thereof, or the like. The conductive terminals 140 may be or may include controlled collapse chip connection (C4) bumps, metal pillars, microbumps, ball grid array (BGA), solder balls, electroless nickel-electroless palladium-immersion gold (ENEPIG) formed bumps, and/or the like.

In some embodiments, the conductive terminals 140 are formed by forming a layer of solder through such as evaporation, plating, printing, ball placement, or the like. A reflow process is optionally performed to shape the layer of solder into the desired bump shapes. In some embodiments, the conductive terminals 140 are metal pillars (e.g., a copper pillar) formed by sputtering, printing, plating, CVD, or the like. The conductive terminals 140 formed as metal pillars may be free of solder and have substantially vertical sidewalls. In some embodiments, a metal cap layer (not shown) is formed on the tops of the conductive terminals 140. The metal cap layer may include nickel, tin, tin-lead, gold, silver, palladium, indium, nickel-palladium-gold, nickel-gold, the like, or a combination thereof.

In some embodiments, after the thinning, a redistribution layer (RDL; not shown) including at least one patterned dielectric layer and at least one patterned conductive layer is formed on the rear surface 111b' of the thinned semiconductor material 111B, where the patterned conductive layer of the RDL is physically and electrically connected to the through vias 116. For example, the patterned conductive layer of the RDL may include a plurality of landing pads, and then the conductive terminals 140 may be formed on the landing pads of the RDL, so that the conductive terminals 140 are electrically coupled to the through vias 116 through the RDL. The configuration of the RDL may facilitate rerouting the electrical connections of the photonic wafer PW.

Referring to FIGS. 1E-1F and also with reference to FIG. 2B, a singulation process is performed to separate the resulting structure into a plurality of individual semiconductor structures 10. It is noted that in the top view of FIG. 2B, the electronic dies ED are located at the bottom of the structure, so that the sidewalls 120s are illustrated in phantom. In some embodiments, the structure shown in FIG. 1D is placed on a dicing tape TP for performing the singulation process. It is noted that the foregoing manufacturing steps are performed at the die-to-wafer level, although the manufacturing method of the semiconductor structure may be performed at the die-to-die level. In some embodiments, the photonic wafer PW is diced along one or more scribe lines SL located in the sacrificial region SR between the rows and/or between the columns. The scribe lines SL may be virtual lines where the dicing is performed. For example, the scribe lines SL pass through the trenches TR1. In some embodiments, the sacrificial region SR is cut off by a dicing tool DT (e.g., a blade, a laser, or the like).

In some embodiments, during the singulation process, the dicing tool DT is positioned within the sacrificial region SR and does not overlap or contact the etched sidewalls SW1 closest to the sidewalls 120s of the corresponding electronic dies ED. For example, as the dicing tool DT travels downwardly toward the remaining portion RP1 in the sacrificial region SR, the dicing tool DT may not be in physical contact with the etched sidewalls SW1 due to the trenches TR1 isolating the dicing tool DT from the die region DR. In some embodiments, the dicing tool DT with a maximum width of MW2 is used to perform the singulation process. The maximum width of MW2 of the dicing tool DT may be of the same width as a cut-off portion having a width range from about 30 μm to about 50 μm. For example, the maximum width MW2 of the dicing tool DT is greater than the maximum width MW1 of the respective trench TR1. In some embodiments, the maximum width MW2 of the dicing tool DT is greater than the maximum width MW3 of the remaining portion RP1, but less than the maximum width of the sacrificial region SR. For example, the maximum width of the sacrificial region SR includes the maximum width MW3 of the remaining portion RP1 and the widths of the pair of the trenches TR1. In some embodiments, a peripheral portion of the thinned semiconductor material 111B close to the conductive terminals 140 and located in the sacrificial region SR may be remained after the singulation process. In some embodiments, the dicing tool DT may remove the remaining portion RP1 in the sacrificial region SR in one cut, but the disclosure is not limited thereto.

In some embodiments, as shown in FIG. 2B, at least one of the through vias 116 revealed by the rear surface 111b' of the thinned semiconductor material 111B may serve as the alignment mark for performing the singulation process. For example, the at least one of the through vias 116 serving as the alignment mark may be located at the corner of the die region DR or may be located at the dummy area within the die region DR. In some embodiments, the at least one of the through vias 116 serving as the alignment mark may be dummy vias. In some other embodiments, the alignment mark for performing the singulation process may be formed in the RDL (not shown) interposed between the conductive terminals 170 and the thinned semiconductor material 111B. In some other embodiments, a portion of the trenches TR1 formed as a certain pattern for alignment during the singulation process. Alternatively, the alignment mark is omitted.

Continue to FIG. 1F, after the singulation process, the individual semiconductor structure 10 is formed. The semiconductor structure 10 may include a recess RS formed at the periphery as shown in the cross-sectional view. The recess RS may be formed during the etching process described in FIG. 1C. For example, as seen from the top view, the recess RS of the semiconductor structure 10 may be of rectangular shape following the sidewalls 120s of the electronic die ED of the semiconductor structure 10. Although the recess RS may have other shape. In some embodiments, the individual semiconductor structure 10 includes the photonic die PD, the electronic die ED bonded to the photonic die PD, the insulating layer 130 disposed on the photonic die PD and laterally covering the electronic die ED, and the conductive terminals 140 disposed on the photonic die PD opposite to the electronic die ED, where the conductive terminals 140 are electrically coupled to the electronic die ED through the through vias 116 of the photonic die PD. For example, the photonic wafer PW is cut to form the photonic die PD. The bonding interface IF of the electronic die ED and the photonic die PD may be substantially leveled with an interface of the insulating layer 130 and the photonic die PD.

The photonic die PD includes the semiconductor substrate 111 having a narrow top and a wide bottom. For example, the top width W4 of the front surface 111t of the semiconductor substrate 111 is less than the bottom width W5 of the rear surface 111b' of the semiconductor substrate 111. Recall that the trenches TR1 may extend into the semiconductor material 111A (shown in FIG. 1C), this means that a portion of the semiconductor material 111A in the sacrificial region SR is removed, thereby causing the narrow top and the wide bottom profile. In some embodiments, the bottom portion 1111 of the semiconductor substrate 111 is wider than the overlying structure (e.g., the insulator layer 112, the redistribution structure 115, and the insulating layer 130 laterally covering the electronic die ED). For example, the bottom portion 1111 of the semiconductor substrate 111 extends beyond lateral extents of the overlying structure (e.g., the insulator layer 112, the redistribution structure 115, and the insulating layer 130 laterally covering the electronic die ED). In some embodiments, the bottom portion 1111 of the semiconductor substrate 111 extends laterally beyond the boundaries (e.g., etched sidewalls SW1) of the overlying structure by a width W6. The width W6 may be viewed as the width of the recess RS, which may be about 10 µm or greater than 10 µm. Although other dimension of the width W6 is also possible.

As illustrated in FIG. 1F, the bottom portion 1111 of the semiconductor substrate 111 has singulated sidewalls SW2 that extend beyond the lateral extents of the overlying structure (e.g., the insulator layer 112, the redistribution structure 115, and the insulating layer 130). The surfaces of the singulated sidewalls SW2 are uneven. Since a portion of the semiconductor material 111A in the sacrificial region SR is removed during the formation of the trenches TR1, the top portion 1112 of the semiconductor substrate 111 connected to the bottom portion 1111 may have the etched sidewalls SW1 that are aligned with the overlying structure (e.g., the insulator layer 112, the redistribution structure 115, and the insulating layer 130). For example, the top portion 1112 of the semiconductor substrate 111 has a same width as the overlying structure (e.g., the insulator layer 112, the redistribution structure 115, and the insulating layer 130).

Continue to FIG. 1F, in some embodiments, the top facet 1111f of the semiconductor substrate 111 is laterally connected to the singulated sidewall SW2 and the etched sidewall SW1. The top facet 1111f may have the width W6 and may be smoother than the singulated sidewall SW2. Since the top facet 1111f and the etched sidewall SW1 are formed during the same process (e.g., the etching process described in FIG. 1C), the texture features of the top facet 1111f and the etched sidewall SW1 may be similar. On the other hand, since the top facet 1111f and the singulated sidewall SW2 are formed during different processes (e.g., etching and dicing), the texture features therebetween may be different. In some embodiments, the top facet 1111f is smoother than the singulated sidewall SW2. As surface roughness is known that provides a measure of the unevenness of the surface height. For example, the surface roughness of the top facet 1111f may be less than the surface roughness of the singulated sidewall SW2. Similarly, since the etched sidewalls SW1 and the singulated sidewalls SW2 are formed by different processes (e.g., etching and dicing), the texture features of the etched sidewalls SW1 and the singulated sidewalls SW2 may be different. In some embodiments, the etched sidewalls SW1 is smoother than the singulated sidewalls SW2. The surface roughness of the singulated sidewalls SW2 may be greater than the surface roughness of the etched sidewalls SW1.

Still referring to FIG. 1F, an optical coupling unit 15 is configured to be optically coupled to the photonic die PD of the semiconductor structure 10. In some embodiments, the optical coupling unit 15 including at least one fiber 15A is an optical input/output (I/O) port where optical signals may enter and/or exit. In some embodiments, a plurality of fibers 15A is arranged in a parallel manner to form a fiber array module optically coupling the semiconductor structure 10. In some embodiments, the fiber 15A faces the edge facet EF on the etched sidewall SW1 of the semiconductor structure 10. For example, the edge facet EF is the sidewall of the dielectric layer 114 that is formed after the etching process described in FIG. 1C. The optical device 113 of the photonic die PD covered by the dielectric layer 114 may be located in proximity to the edge facet EF for optically coupling. Since the semiconductor structure 10 attains smoother edge facet EF by using the etching process, the coupling loss between the optical coupling unit 15 and the photonic die PD of the semiconductor structure 10 may be reduced.

For example, the fiber 15A of the optical coupling unit 15 is substantially aligned with the optical device 113 of the photonic die PD. In some embodiments in which the optical device 113 includes the edge coupler, the fiber axis of the fiber 15A is substantially perpendicular to the etched sidewall SW1. In some other embodiments, the fiber 15A is directed at an angle (e.g., between a few degrees to about 90 degrees) to the etched sidewall SW1. The angle between the fiber axis and the etched sidewall SW1 may be adjusted depending on the characteristics of the fiber 15A and depending on how well the optical connection is optimized. In some embodiments, an optical adhesive (not shown) is adhered the fiber 15A to the photonic die PD of the semiconductor structure 10 so as to provide optical transparency and mechanical fixation. For example, the optical adhesive is index-matched to the fiber 15A and to the edge facet EF of the semiconductor structure 10 for reducing optical loss. In some embodiment, the dielectric layer 114 of the photonic die PD provides an index-matched interface on the etched sidewall SW1 for coupling the fiber 15A of the optical coupling unit 15.

The semiconductor structure 10 discussed herein may provide broad bandwidth and robust optical signal I/O communication. In some embodiments, the semiconductor structure 10 is viewed as a die including the photonic integrated circuit (PIC) and the electronic integrated circuit (EIC). For example, the semiconductor structure 10 is subsequently packaged using IC packaging techniques, such as integrated fanout (InFO) packaging techniques or the like. In some embodiments, the conductive terminals 140 of the semiconductor structure 10 are in physical and electrical contact with another package component such as a printed circuit board (PCB), a printed wiring board, a package substrate, an interposer, and/or other circuit carrier that is capable of carrying integrated circuits. The semiconductor structure 10 may be connected to or may be a part of a switch, a hub, a bridge, a router, a communication system, a data center, a network, and/or a computer system (e.g., a multiple-core processor computer system). In some embodiments, the semiconductor structure 10 may be a part of an electronic system such as computers (e.g., high-performance computer), computational devices used in conjunction with an artificial intelligence system, wireless communication devices, computer-related peripherals, entertainment devices, etc. It should be noted that other electronic applications are also possible.

Figure 3A:
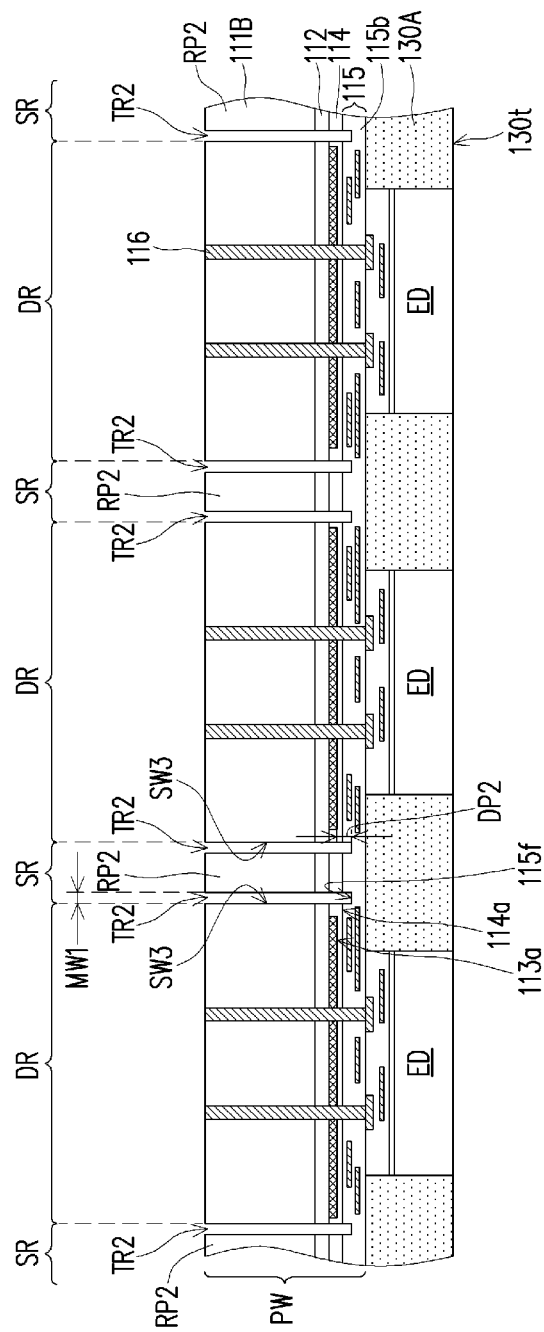
FIGS. 3A-3D are schematic cross-sectional views of various stages of manufacturing a semiconductor structure in accordance with some embodiments.
Figure 3B:
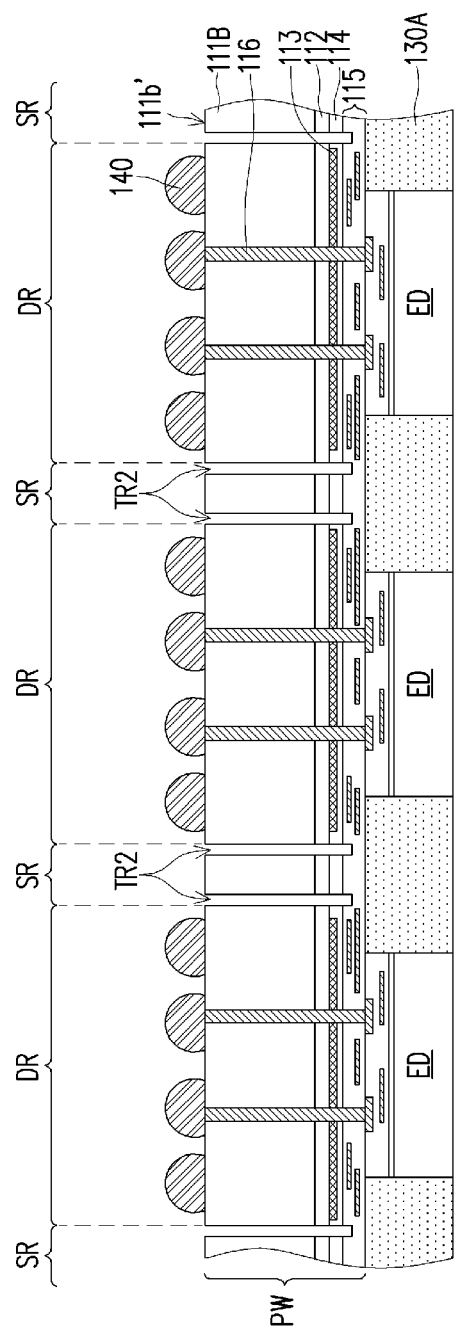
Figure 3C:
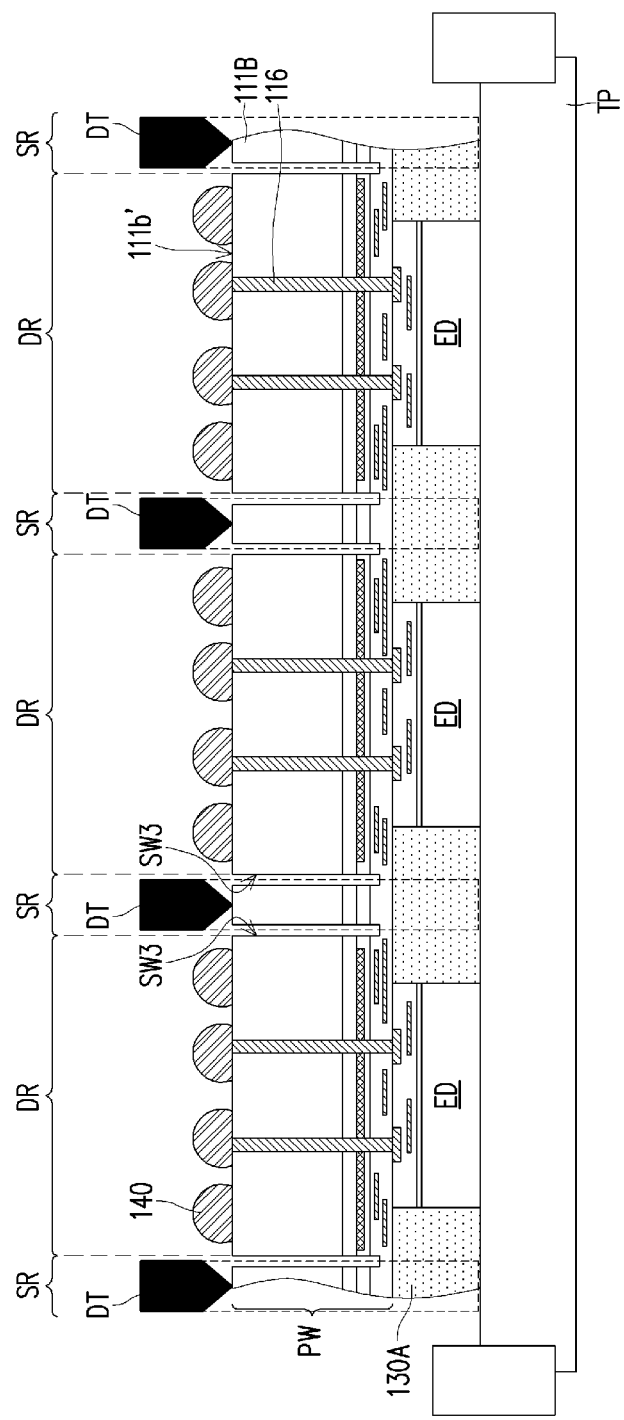
Figure 3D:
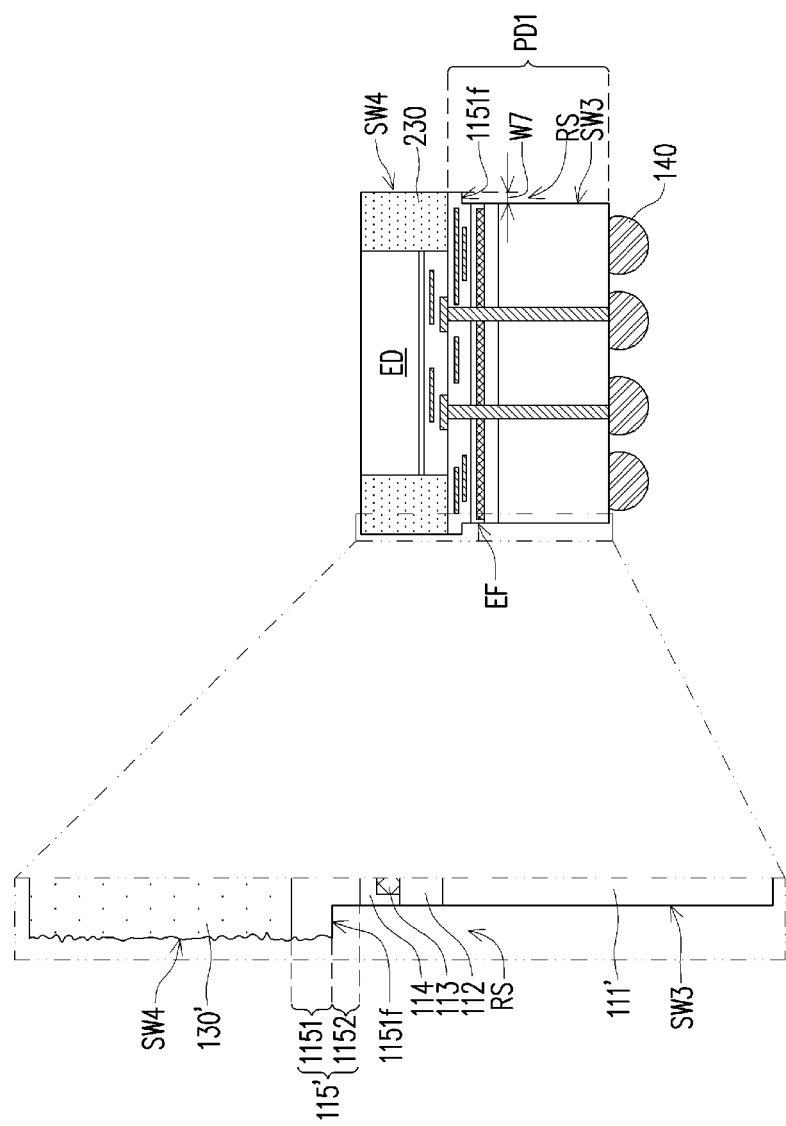

FIGS. 3A-3D are schematic cross-sectional views of various stages of manufacturing a semiconductor structure in accordance with some embodiments. The manufacturing method of the semiconductor structure 20 shown in FIG. 3D is similar to that of the semiconductor structure 10. Only the differences therebetween will be discussed, the like or the same part will not be repeated again, and the like numeral references indicate the like elements.

Referring to FIG. 3A, a plurality of trenches TR2 may be formed in the photonic wafer PW. In some embodiments, after forming the insulating material 130A as described in FIG. 1B, the resulting structure is turned upside down for forming the trenches TR2 into the photonic wafer PW. For example, the resulting structure is flipped and disposed on a temporary carrier or a dicing tape for further processing. In some embodiments, the thinning process is performed on the rear surface 111b of the semiconductor material 111A to reveal at least a portion of the through vias 116, and then the trenches TR2 are formed in the thinned semiconductor material 111B. In some other embodiments, the trenches TR2 are formed prior to the thinning process. That is, after the trenches TR2 are formed, the through vias 116 may not be revealed by the semiconductor material 111A. The forming process of the trenches TR2 may be similar to the process described in FIG. 1C, so the detailed descriptions are not repeated for simplicity.

In some embodiments, the respective trench TR2 is formed in the thinned semiconductor material 111B (or the semiconductor material 111A in accordance with some embodiments) and further extends into the underlying insulator layer 112 and the underlying dielectric layer 114. In some embodiments, the trenches TR2 further extends into the redistribution structure 115. For example, the respective trench TR2 ends at the intermediate level of the redistribution structure 115. In some embodiments, a facet 115f of the dielectric layer 115b of the redistribution structure 115 is accessibly exposed by the trenches TR2. In some embodiments, the respective trench TR2 ends at the interface between the dielectric layer 114 and the dielectric layers 115b of the redistribution structure 115. In some other embodiments, the respective trench TR2 penetrates through the redistribution structure 115. In some alternative embodiments, the respective trench TR2 penetrates through the photonic wafer PW and further extends to the insulating material 130A, but may not penetrate through the insulating material 130A at this stage. For example, the etch operation is terminated after a predetermined time period so that the bottom of the respective trench TR2 ends in the middle of the insulating material 130A. The details thereof will be described later in accompanying with FIGS. 5A-5B.

For example, the trenches TR2 are formed in the sacrificial region SR, where the sacrificial region SR is located between adjacent two of the die regions DR, and at least one electronic die ED is located in the respective die region DR. In some embodiments, two neighboring trenches TR2 are physically separated from one another by a remaining portion RP2 in the sacrificial region SR. For example, the remaining portion RP2 includes the thinned semiconductor material 111B (or the semiconductor material 111A in accordance with some embodiments), the underlying insulator layer 112, the underlying dielectric layer 114, and the underlying redistribution structure 115.

In some embodiments, a vertical distance DP2 is measured from the bottom of the trench TR2 to the first surface 113a of the optical device 113 that is covered by the dielectric layer 114. Recall that the facet 115f of the redistribution structure 115 is accessibly exposed by the trench TR2, so that the vertical distance DP2 may be the distance between the facet 115f of the redistribution structure 115 and the first surface 113a of the optical device 113 in accordance with some embodiments. For example, the vertical distance DP2 is non-zero. In some embodiments, the vertical distance DP2 is about 10 μm or greater than 10 μm, although other dimension is also possible. Again, it should be noted that the trenches TR2 may have various depths, aspect ratios, shapes and profiles, depending upon the process recipe; the illustration of the trenches TR2 is merely an example.

In some embodiments, after forming the trenches TR2, the thinned semiconductor material 111B (or the semiconductor material 111A in accordance with some embodiments), the underlying insulator layer 112, the underlying dielectric layer 114, and the underlying redistribution structure 115 may have substantially coterminous sidewalls. The trenches TR2 may be formed by the etching process and the coterminous sidewalls that define the trench TR2 may be referred to as the etched sidewalls SW3. In some embodiments, the etched sidewalls SW3 that define the trench TR2 are straight and vertical. In some other embodiments, the trench TR2 narrowing toward the redistribution structure 115 may cause the etched sidewalls SW3 being sloped. In some embodiments, the maximum width MW1 of the trench TR2 ranges from about 2 μm to about 50 μm.

Referring to FIG. 3B, the conductive terminals 140 may be formed over the rear surface 111b' of the thinned semiconductor material 111B. In some embodiments in which the trenches TR2 are formed after the thinning process, the conductive terminals 140 are formed within the die regions DR after the formation of the trenches TR2. The RDL (not shown; mentioned above) is optionally formed on the rear surface 111b' of the thinned semiconductor material 111B prior to forming the conductive terminals 140. In some other embodiments in which the trenches TR2 are formed prior to the thinning process, the semiconductor material 111A may be thinned after forming the trenches TR2 to accessibly reveal at least a portion of the through vias 116, and then the conductive terminals 140 are formed over the thinned semiconductor material 111B to electrically coupling the through vias 116. The material and the forming process of the conductive terminals 140 may be similar to those of the conductive terminals 140 described in FIG. 1D, so the detailed descriptions are omitted for the sake of brevity.

Referring to FIGS. 3C-3D, a singulation process is performed to separate the resulting structure into a plurality of individual semiconductor structures 20. In some embodiments, the resulting structure is placed on the dicing tape TP for performing the singulation process. In some embodiments, the photonic wafer PW is diced along the scribe lines SL located in the sacrificial region SR. In some embodiments, the dicing tool DT is position to the remaining portion RP2 in the sacrificial region SR and cuts downward from the rear surface 111b' of the thinned semiconductor material 111B. In some embodiments, the sacrificial region SR has a maximum width greater than the width of the dicing tool DT, so that when the dicing tool DT acts downwardly toward the insulating material 130A, the dicing tool DT does not contact the etched sidewalls SW3. As the dicing tool DT cuts through the insulating material 130A, a peripheral portion of the insulating material 130A in the sacrificial region SR may be remained due to the width of the dicing tool DT being less than the width of the sacrificial region SR. The trenches TR2 may isolate the dicing tool DT from the die region DR. The singulation process may be similar to the process described in FIG. 1E, so the detailed descriptions are omitted for the sake of brevity.

As illustrated in FIG. 3D, the individual semiconductor structure 20 includes the recess RS formed at the periphery as shown in the cross-sectional view. In some embodiments, the semiconductor structure 20 includes the photonic die PD1 having a wide top and a narrow bottom, the electronic die ED bonded to the photonic die PD1, and the insulating layer 230 disposed on the photonic die PD1 and laterally covering the electronic die ED. For example, since a peripheral portion of the redistribution structure 115 is etched when forming the trenches TR2 as shown in FIG. 3A, the top portion 1151 of the redistribution structure 115' extends beyond lateral extents of the bottom portion 1152 of the redistribution structure 115' connected to the top portion 1151. The top portion 1151 of the redistribution structure 115' and the overlying insulating layer 230 may form coterminous sidewalls. Since the coterminous sidewalls are formed by the singulation process, the sidewalls of the top portion 1151 of the redistribution structure 115' and the overlying insulating layer 230 may be referred to as the singulated sidewalls SW4.

For example, the bottom portion 1152 of the redistribution structure 115' is narrower than the top portion 1151. In some embodiments, the bottom portion 1152 of the redistribution structure 115' has a same width as the underlying structure (e.g., the dielectric layer 114, the insulator layer 112, and the semiconductor substrate 111'). The sidewalls of the bottom portion 1152 of the redistribution structure 115' and the underlying structure (e.g., the dielectric layer 114, the insulator layer 112, and the semiconductor substrate 111') may form the coterminous sidewalls and may be viewed as the etched sidewalls SW3. The facet 1151f of the redistribution structure 115' may be laterally connected to the singulated sidewall SW4 and the etched sidewall SW3. For example, the top portion 1151 of the redistribution structure 115' extends laterally beyond the etched sidewalls SW3 of the underlying structure by a width W7. The width W7 may be the width of the recess RS and may also be the horizontal width of the facet 1151f. For example, the width W7 is about 10 μm or greater than 10 μm. Although other dimension of the width W7 is also possible.

Since the singulated sidewalls SW4 and the etched sidewalls SW3 are formed by different processes (e.g., dicing and etching), the texture features therebetween may be different. For example, the surface roughness of the singulated sidewalls SW4 is greater than that of the etched sidewalls SW3 as shown in the enlarged view of FIG. 3D. In some embodiments, the sidewalls of the top portion 1151 and the bottom portion 1152 of the redistribution structure 115' formed by different processes may have different surface roughness. The edge facet EF on the etched sidewall SW3 for optically coupling the fiber 15A may be smoother than the singulated sidewall SW4. This configuration facilitates coupling to the fiber 15A of the optical coupling unit 15 (shown in FIG. 1F) and attaints better optical coupling.

Figure 4A:
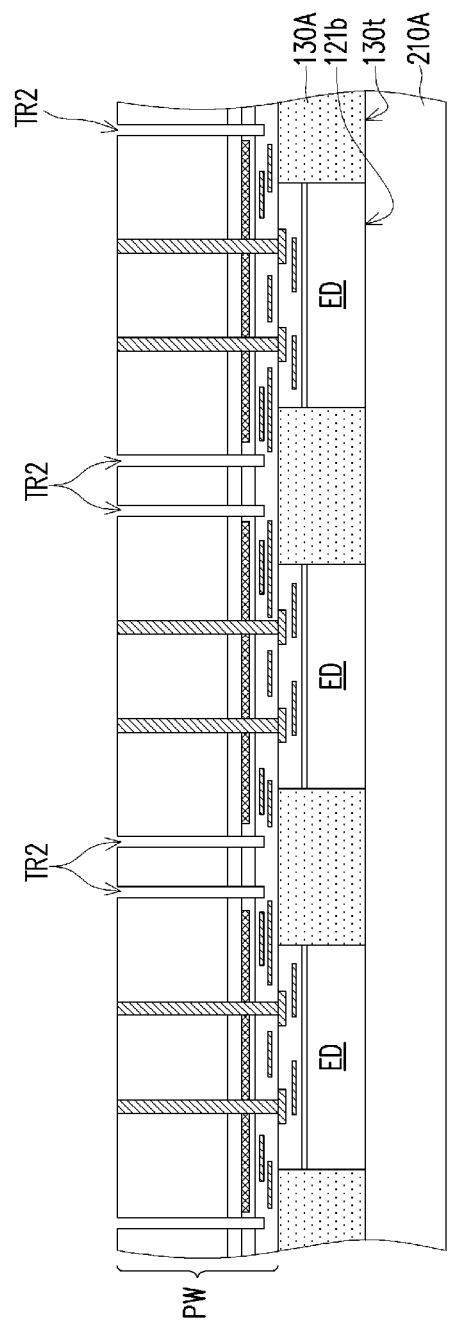
FIGS. 4A-4B are schematic cross-sectional views of various stages of manufacturing a semiconductor structure in accordance with some embodiments.
Figure 4B:
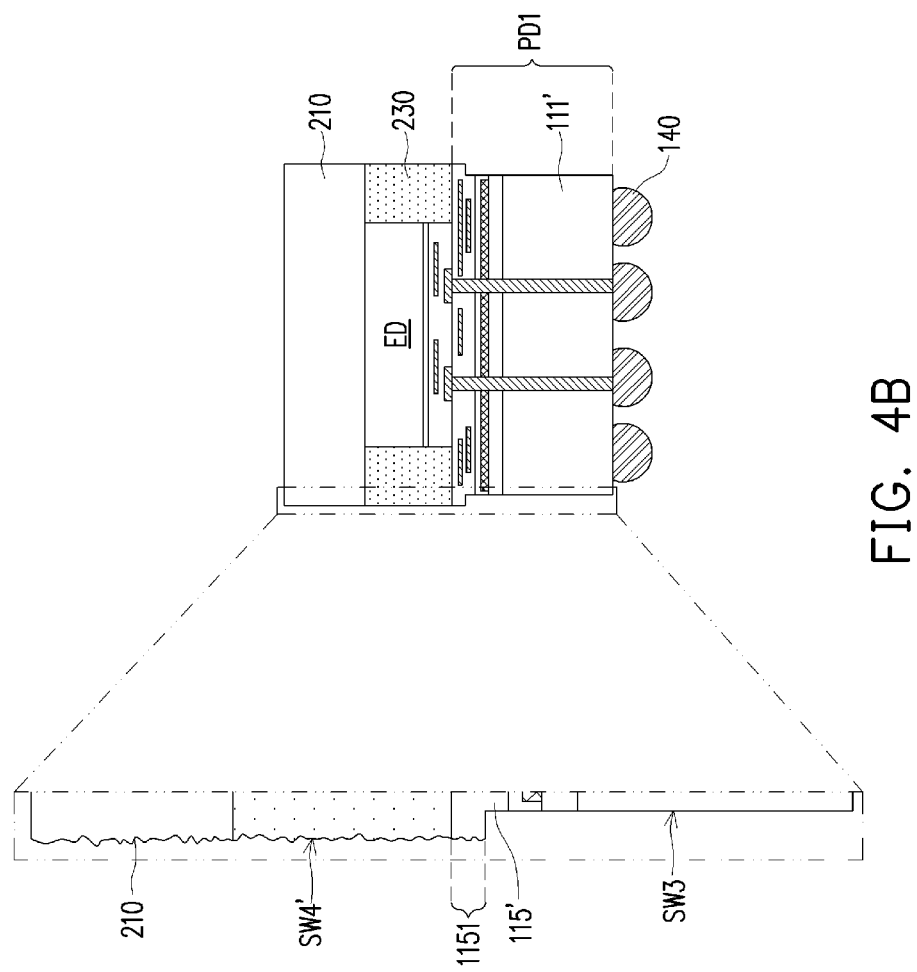

FIGS. 4A-4B are schematic cross-sectional views of various stages of manufacturing a semiconductor structure in accordance with some embodiments. The manufacturing method of the semiconductor structure 30 shown in FIG. 4B is similar to that of the semiconductor structure 20 described in FIG. 3D. Only the differences therebetween will be discussed, the like or the same part will not be repeated again, and the like numeral references indicate the like elements.

Referring to FIG. 4A, the structure may be the resulting structure illustrated in FIG. 3A and further provided with a supporting wafer 210A. For example, after forming the insulating material 130A as described in FIG. 1B, the supporting wafer 210A is disposed on the insulating material 130A and the electronic dies ED. In some embodiments, the supporting wafer 210A is bonded to the first surface 130t of the insulating material 130A and the rear surfaces 121b of the electronic dies ED by such as a thermal bonding process, a gluing process, a pressure bonding process, a combination thereof, or other suitable bonding processes.

For example, the supporting wafer 210A is a silicon wafer. In some embodiments, the supporting wafer 210A includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may be used. In some embodiments, the supporting wafer 210A is made of glass, ceramic, metal, or other suitable materials which have a certain degree of rigidity. The thickness of the supporting wafer 210A may be adjusted to control the warpage of the underlying structure.

In some embodiments, after disposing the supporting wafer 210A on the insulating material 130A and the electronic dies ED, the structure is turned upside down for forming the trenches TR2 in the photonic wafer PW. The forming process of the trenches TR2 and the subsequent processes (e.g., forming the conductive terminals 140, dicing the structure, etc.) may be similar to the processes described in FIGS. 3A-3C, so the detailed descriptions are not repeated for the sake of brevity.

Referring to FIG. 4B, the individual semiconductor structure 30 is formed after the singulation process is completed. The semiconductor structure 30 is similar to the semiconductor structure 20 described in FIG. 3D, except that the semiconductor structure 30 further includes the supporting substrate 210. For example, the supporting substrate 210 is disposed on the insulating layer 230 and the electronic die ED for mechanical support. In some embodiments, the dicing tool cuts through the supporting wafer 210A during the singulation process to form the supporting substrate 210, such that the supporting substrate 210 has a same width as the underlying structure. The supporting substrate 210, the underlying insulating layer 230, and the underlying top portion 1151 of the redistribution structure 115' may form coterminous sidewalls. Since the coterminous sidewalls are formed by the singulation process, the sidewalls of the supporting substrate 210, the underlying insulating layer 230, and the underlying top portion 1151 of the redistribution structure 115' may be referred to as the singulated sidewalls SW4'. For example, the sidewalls of the supporting substrate 210 formed by the singulation are smoother than the sidewalls of the semiconductor substrate 111'.

Figure 5A:
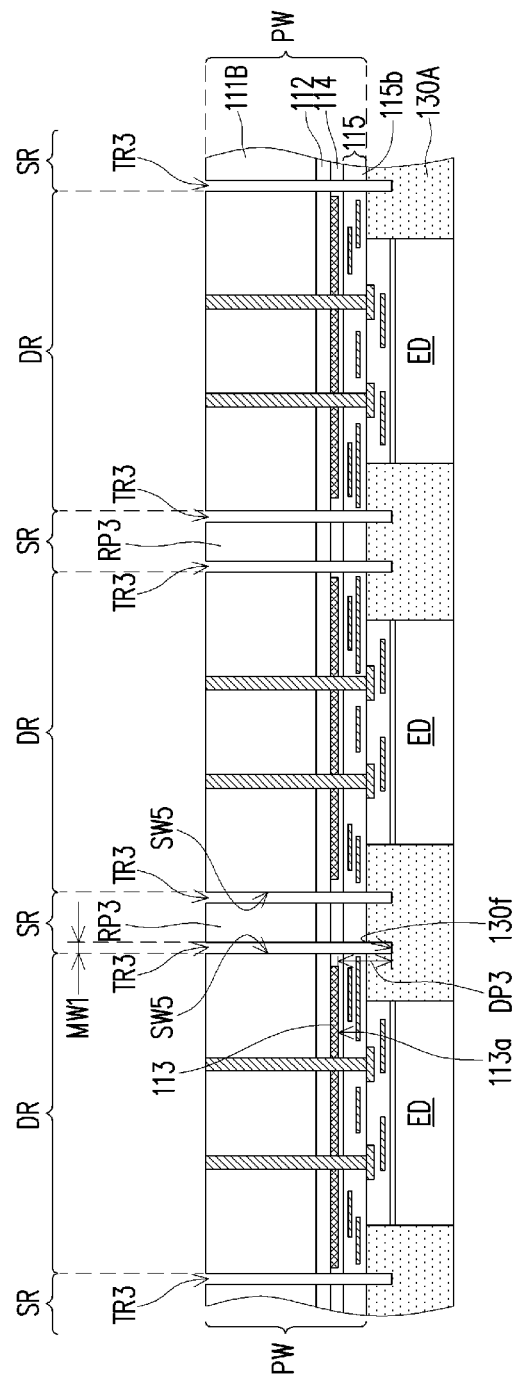
FIGS. 5A-5B are schematic cross-sectional views of various stages of manufacturing a semiconductor structure in accordance with some embodiments.
Figure 5B:
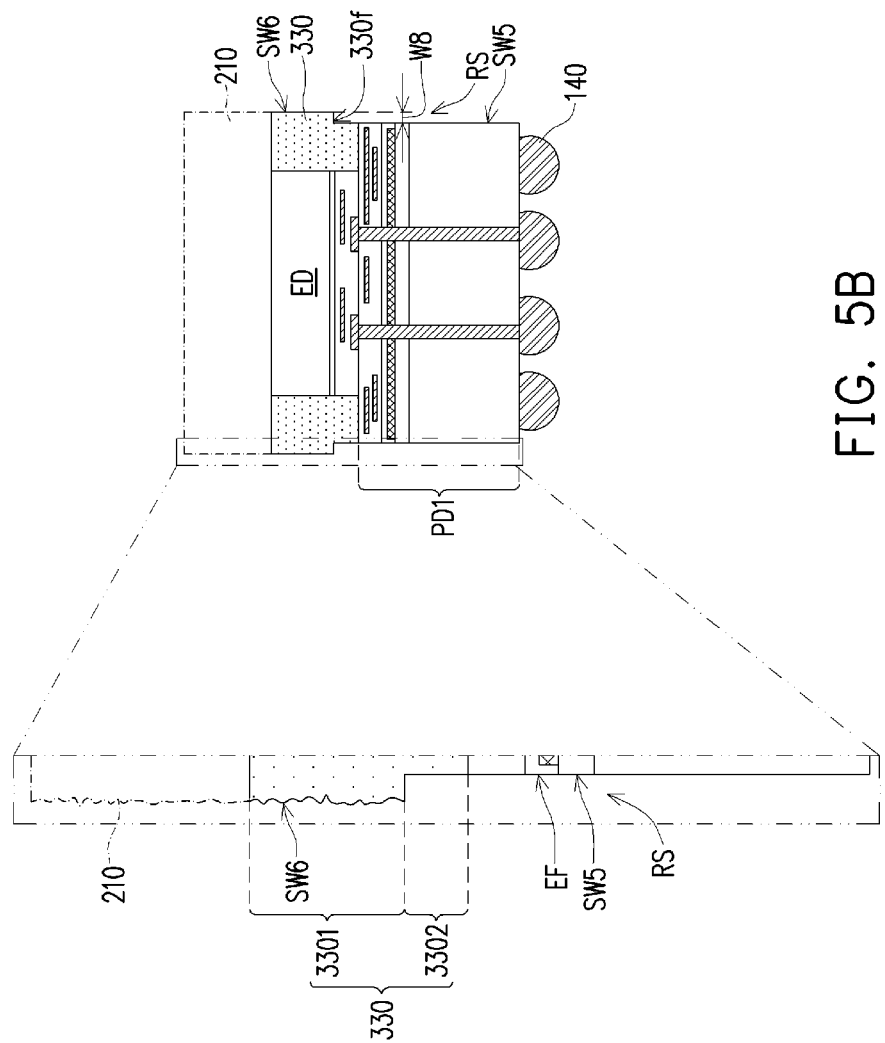

FIGS. 5A-5B are schematic cross-sectional views of various stages of manufacturing a semiconductor structure in accordance with some embodiments. The manufacturing method of the semiconductor structure 40 shown in FIG. 5B is similar to that of the semiconductor structure 20 described in FIG. 3D. Only the differences therebetween will be discussed, the like or the same part will not be repeated again, and the like numeral references indicate the like elements.

Referring to FIG. 5A, a plurality of trenches TR3 may be formed in the photonic wafer PW. The forming process of the trenches TR3 may be similar to the process described in FIG. 3A or FIG. 1C, so the detailed descriptions are not repeated for simplicity. The difference between the trenches TR3 shown in FIG. 5A and the trenches TR2 shown in FIG. 3A includes the depth of the respective trench TR. For example, the respective trench TR3 penetrates through the photonic wafer PW (e.g., the thinned semiconductor material 111B (or the semiconductor material 111A in accordance with some embodiments), the underlying insulator layer 112 and the underlying dielectric layer 114, and the underlying redistribution structure 115) and further extends into the insulating material 130A.

For example, the trenches TR3 are formed in the sacrificial region SR located between adjacent two of the die regions DR. In some embodiments, adjacent two of the trenches TR3 are physically separated from one another by a remaining portion RP3 in the sacrificial region SR. For example, the remaining portion RP3 includes the thinned semiconductor material 111B (or the semiconductor material 111A in accordance with some embodiments), the underlying insulator layer 112, the underlying dielectric layer 114, and the underlying redistribution structure 115, and the insulating material 130A. For example, the bottom of the trench TR3 is at an intermediate level between the first surface 130t of the insulating material 130A and the interface of the insulating material 130A and the photonic wafer PW. The insulating material 130A may not be penetrated through by the trenches TR3 at this stage in accordance with some embodiments.

In some embodiments, a facet 130f of the insulating material 130A is accessibly exposed by the trenches TR3. In some embodiments, a vertical distance DP3 is measured from the bottom of the trench TR3 to the first surface 113a of the optical device 113 that is covered by the dielectric layer 114. The vertical distance DP3 may be the distance between the facet 130f of the insulating material 130A and the first surface 113a of the optical device 113 in accordance with some embodiments. For example, the vertical distance DP3 is non-zero. In some embodiments, the vertical distance DP3 is about 10 µm or greater than 10 µm, although other dimension is also possible.

In some embodiments, the photonic wafer PW and the underlying insulating material 130A have substantially coterminous sidewalls that define the respective trench TR3. The coterminous sidewalls may be referred to as the etched sidewalls SW5. In some embodiments, the etched sidewalls SW5 that define the trench TR3 are straight and vertical. The etched sidewalls SW5 may be inclined in accordance with some embodiments. In some embodiments, the maximum width MW1 of the trench TR3 ranges from about 2 µm to about 50 µm. Again, it should be noted that the trenches TR3 may have various depths, aspect ratios, shapes and profiles, depending upon the process recipe; the illustration of the trenches herein is merely an example.

In some embodiments, after forming the trenches TR3, the subsequent processes (e.g., forming the conductive terminals 140, dicing the structure, etc.) may be similar to the processes described in FIGS. 3A-3C, so the detailed descriptions are not repeated for the sake of brevity. In some embodiments, during the singulation process, the dicing tool cuts downward from the photonic wafer PW and further cuts through the insulating material 130A to form a plurality of the semiconductor structure 40. As the dicing tool travels downwardly toward the remaining portion RP3 in the sacrificial region SR, the dicing tool may not contact the etched sidewalls SW5 due to the trenches TR3 isolating the dicing tool from the die region DR.

Referring to FIG. 5B, the individual semiconductor structure 40 is formed after the singulation process is completed. The semiconductor structure 40 is similar to the semiconductor structure 20 described in FIG. 3D, except that the semiconductor structure 40 has a deeper recess RS. For example, the insulating layer 330 of the semiconductor structure 40 covering the electronic die ED have a wide top and a narrow bottom. Recall that the trenches TR3 may extend into the insulating material 130A, this means that a portion of the insulating material 130A in the sacrificial region SR is removed, thereby causing the wide top and the narrow bottom profile.

For example, the insulating layer 330 includes a top portion 3301 and a bottom portion 3302 connected to the top portion 3301 and the photonic die PD1. The top portion 3301 may be wider than the bottom portion 3302. In some embodiments, the bottom portion 3302 has a same width as the photonic die PD1. The sidewalls of the bottom portion 3302 and the photonic die PD1 may form the coterminous sidewalls and may be viewed as the etched sidewalls SW5. Since the dicing tool may cut through the insulating material 130A during the singulation process, the sidewalls of the top portion 3301 may be referred to as the singulated sidewalls SW6. The facet 330f of the insulating layer 330 formed during the etching process may be laterally connected to the singulated sidewall SW6 and the etched sidewall SW5. For example, the top portion 3301 of the insulating layer 330 extends laterally beyond the etched sidewalls SW5 of the underlying structure by a width W8. The width W8 may be the width of the recess RS and may also be the horizontal width of the facet 330f. For example, the width W8 is about 10 µm or greater than 10 µm, although other dimension is also possible.

Since the singulated sidewalls SW6 and the etched sidewalls SW5 are formed by different processes (e.g., dicing and etching), the texture features therebetween may be different. For example, the surface roughness of the singulated sidewalls SW6 is greater than that of the etched sidewalls SW5 as shown in the enlarged view of FIG. 5B. In some embodiments, the sidewalls of the top portion 3301 and the bottom portion 3302 of the insulating layer 330 formed by different processes may have different surface roughness. The edge facet EF on the etched sidewall SW5 for optically coupling the fiber 15A is smoother than the singulated sidewall SW6 of the insulating layer 330. This configuration facilitates coupling to the fiber 15A of the optical coupling unit 15 (shown in FIG. 1F) and attaints better optical coupling.

In some other embodiments, the semiconductor structure 40 further includes the supporting substrate 210 disposed on the insulating layer 330 and the electronic die ED. The supporting substrate 210 may be bonded to the insulating layer 330 and the electronic die ED after forming the insulating layer 330 as described in FIG. 4A. For example, during the singulation process, the dicing tool travels downwardly to cut through the insulating material 130A and the underlying supporting substrate 210. Under this scenario, the supporting substrate 210 and the top portion 3301 of the insulating layer 330 may form the coterminous and singulated sidewalls. The supporting substrate 210 may thus be wider than the photonic die PD1. Alternatively, the supporting substrate 210 is omitted, so that the supporting substrate 210 is illustrated in phantom to indicate it may be or may not be present.

Figure 6:
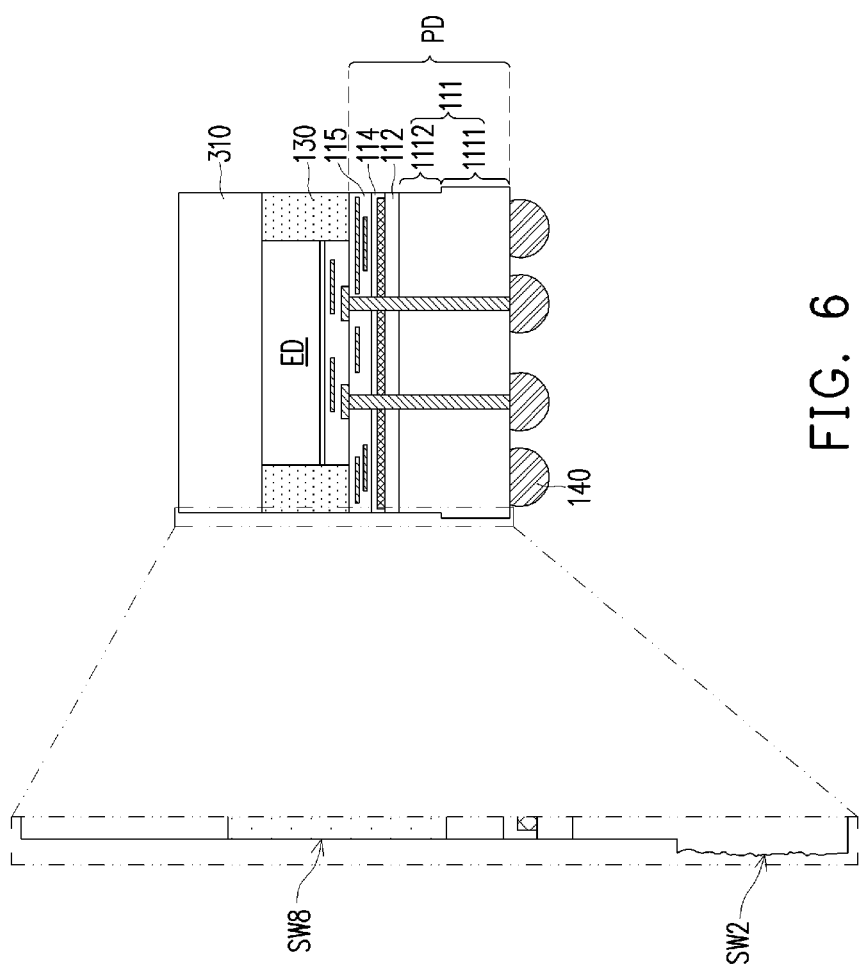
FIG. 6 is a schematic cross-sectional view of a semiconductor structure in accordance with some embodiments.

FIG. 6 is a schematic cross-sectional view of a semiconductor structure in accordance with some embodiments. The semiconductor structure 50 is similar to the semiconductor structure 10 described in FIG. 1F. Only the differences therebetween will be discussed, the like or the same part will not be repeated again, and the like numeral references indicate the like elements.

Referring to FIG. 6, the semiconductor structure 50 includes the supporting substrate 310 disposed on the insulating layer 130 and the electronic die ED. The supporting wafer may be bonded to the insulating layer 130 and the electronic die ED after forming the insulating layer 130 as described in FIG. 1B. The trenches may be subsequently formed in the supporting wafer and the underlying structure, but may not penetrate through the photonic wafer PW. Accordingly, the supporting wafer, the underlying insulating material, the underlying redistribution structure, the underlying dielectric layer, the underlying insulator layer, and the underlying semiconductor material may have substantially coterminous sidewalls. The coterminous sidewalls that define the trench are referred to as the etched sidewalls SW8. The subsequent processes (e.g., forming the conductive terminals 140, dicing the structure, etc.) may be similar to the processes described in FIGS. 1D-1E. For example, during the singulation process, the dicing tool travels from the photonic wafer PW and goes downwardly to remove the remaining portion including the supporting wafer in the sacrificial region, where the dicing tool may not contact the etched sidewalls due to the trenches isolating the dicing tool from the die region.

After the singulation process is complete, the individual semiconductor structure 50 is formed. For example, the individual semiconductor structure 50 includes the bottom portion 1111 of the semiconductor substrate 111 extends beyond lateral extents of the overlying structure (e.g., the insulator layer 112, the dielectric layer 114, the redistribution structure 115, the insulating layer 130, and the supporting substrate 310). The bottom portion 1111 of the semiconductor substrate 111 may be wider than the supporting substrate 310. Since the bottom portion 1111 of the semiconductor substrate 111 and the supporting substrate 310 are formed by different processes, the texture features therebetween may be different. For example, the sidewalls of the supporting substrate 310 formed by the etching process are smoother than the singulated sidewalls SW2. The edge facet EF on the etched sidewall SW8 for optically coupling is smoother than the singulated sidewall SW2. This configuration facilitates coupling to the fiber 15A of the optical coupling unit 15 (shown in FIG. 1F) and attaints better optical coupling.

According to some embodiments, a semiconductor structure includes an encapsulated die including an electronic die and an insulating layer laterally covering the electronic die, and a photonic die coupled to the encapsulated die. The photonic die includes an optical device in proximity to an edge coupling facet of a portion of a sidewall of the photonic die, where a surface roughness of the edge coupling facet is less than a surface roughness of a sidewall of the insulating layer or a surface roughness of another portion of the sidewall of the photonic die.

According to some alternative embodiments, a semiconductor structure includes an encapsulated die including an electronic die and an insulating layer laterally covering the electronic die, and a photonic die coupled to the encapsulated die. The photonic die includes a first portion underlying the electronic die and having a first width substantially equal to a width of the encapsulated die, a second portion underlying the first portion and having a second width different from the first width, and an optical device embedded in the first portion or the second portion and being in proximity to an edge coupling facet of the photonic die.

According to some alternative embodiments, a semiconductor structure includes an encapsulated die including an electronic die and an insulating layer laterally covering the electronic die, and a photonic die coupled to the encapsulated die. The insulating layer includes a protruded portion and a recessed portion connected to the protruded portion. The photonic die includes an optical device in proximity to an edge coupling facet of the photonic die, where a surface roughness of the edge coupling facet is less than a surface roughness of a sidewall of the protruded portion of the insulating layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor structure, comprising:
an encapsulated die comprising an electronic die and an insulating layer laterally covering the electronic die; and
a photonic die coupled to the encapsulated die and comprising:
an optical device in proximity to an edge coupling facet of a portion of a sidewall of the photonic die, wherein a surface roughness of the edge coupling facet is less than a surface roughness of a sidewall of the insulating layer or a surface roughness of another portion of the sidewall of the photonic die.

2. The semiconductor structure of claim 1, wherein:
the edge coupling facet is on a recessed portion of the photonic die,
the recess portion of the photonic die is interposed between the encapsulated die and a protruded portion of the photonic die, and
the surface roughness of the edge coupling facet is less than a surface roughness of the protruded portion of the photonic die.

3. The semiconductor structure of claim 2, further comprising:
a supporting substrate overlying the encapsulated die, wherein a surface roughness of a sidewall of the supporting substrate is less than the surface roughness of the protruded portion of the photonic die.

4. The semiconductor structure of claim 1, wherein:
the edge coupling facet is on a recessed portion of the photonic die,
a protruded portion of the photonic die is interposed between the encapsulated die and the recessed portion of the photonic die, and
the surface roughness of the edge coupling facet is less than a surface roughness of the protruded portion of the photonic die.

5. The semiconductor structure of claim 4, further comprising:
a supporting substrate overlying the encapsulated die, wherein a surface roughness of a sidewall of the supporting substrate is greater than the surface roughness of the edge coupling facet of the photonic die.

6. The semiconductor structure of claim 1, wherein:
a recessed portion of the insulating layer is between a protruded portion of the insulating layer and the photonic die, and
the surface roughness of the edge coupling facet is less than a surface roughness of a sidewall of the protruded portion of the insulating layer.

7. The semiconductor structure of claim 6, wherein the surface roughness of the sidewall of the protruded portion of the insulating layer is greater than a surface roughness of a sidewall of the recessed portion of the insulating layer.

8. The semiconductor structure of claim 6, further comprising:
a supporting substrate overlying the encapsulated die, wherein a surface roughness of a sidewall of the supporting substrate is greater than the surface roughness of the edge coupling facet of the photonic die.

9. A semiconductor structure, comprising:
an encapsulated die comprising an electronic die and an insulating layer laterally covering the electronic die; and
a photonic die coupled to the encapsulated die and comprising:
a first portion underlying the electronic die and having a first width substantially equal to a width of the encapsulated die;
a second portion underlying the first portion and having a second width different from the first width; and
an optical device embedded in the first portion or the second portion and being in proximity to an edge coupling facet of the photonic die.

10. The semiconductor structure of claim 9, wherein the first width of the first portion is less than the second width of the second portion.

11. The semiconductor structure of claim 10, wherein the optical device is embedded in the first portion, and the edge coupling facet on a sidewall of the first portion is smoother than a sidewall of the second portion.

12. The semiconductor structure of claim 10, wherein:
the photonic die comprises a semiconductor substrate and an interconnect structure overlying the semiconductor substrate,
the first portion is a lower portion of the semiconductor substrate, and
the second portion comprises an upper portion of the semiconductor substrate connected to the lower portion, and the interconnect structure overlying the upper portion of the semiconductor substrate.

13. The semiconductor structure of claim 10, further comprising:
a supporting substrate overlying the encapsulated die and having a width substantially equal to the width of the encapsulated die.

14. The semiconductor structure of claim 9, wherein the first width of the first portion is greater than the second width of the second portion.

15. The semiconductor structure of claim 14, wherein the optical device is embedded in the second portion, and a sidewall of the first portion is rougher than the edge coupling facet on a sidewall of the second portion.

16. The semiconductor structure of claim 14, wherein:
the photonic die comprises a semiconductor substrate and an interconnect structure overlying the semiconductor substrate,
the first portion is an upper portion of the interconnect structure, and
the second portion comprises a lower portion of the interconnect structure connected to the upper portion, and the semiconductor substrate.

17. The semiconductor structure of claim 14, further comprising:
a supporting substrate overlying the encapsulated die and having a width substantially equal to the width of the encapsulated die.

18. A semiconductor structure, comprising:
an encapsulated die comprising an electronic die and an insulating layer laterally covering the electronic die, the insulating layer comprising a protruded portion and a recessed portion connected to the protruded portion; and
a photonic die coupled to the encapsulated die and comprising:
an optical device in proximity to an edge coupling facet of the photonic die, wherein a surface roughness of the edge coupling facet is less than a surface roughness of a sidewall of the protruded portion of the insulating layer.

19. The semiconductor structure of claim 18, wherein the recessed portion of the insulating layer is between the protruded portion and the photonic die and has a width substantially equal to a width of the photonic die.

20. The semiconductor structure of claim 18, wherein a surface roughness of a sidewall of the recessed portion of the insulating layer is less than the surface roughness of the sidewall of the protruded portion of the insulating layer.

* * * * *